(12) United States Patent
Gorman et al.

(10) Patent No.: US 9,799,413 B2
(45) Date of Patent: Oct. 24, 2017

(54) MULTI-DOMAIN FUSE MANAGEMENT

(71) Applicant: Invecas, Inc., Santa Clara, CA (US)

(72) Inventors: Kevin W. Gorman, Essex, VT (US);
Thomas Chadwick, Essex, VT (US);
Nancy Pratt, Essex, VT (US)

(73) Assignee: Invecas, Inc., Santa Clara, CA (US)

( * ) Notice: Subject to any disclaimer, the term of this patent is extended or adjusted under 35 U.S.C. 154(b) by 149 days.

(21) Appl. No.: 15/012,721

(22) Filed: Feb. 1, 2016

(65) Prior Publication Data

US 2016/0224451 A1    Aug. 4, 2016

Related U.S. Application Data

(60) Provisional application No. 62/111,605, filed on Feb. 3, 2015.

(51) Int. Cl.
*G11C 29/00* (2006.01)
*G11C 29/44* (2006.01)

(52) U.S. Cl.
CPC .... *G11C 29/785* (2013.01); *G11C 2029/4402* (2013.01)

(58) Field of Classification Search
CPC .......... G11C 29/785; G11C 2029/4402; G11C 2929/0409; G11C 2029/1208; G11C 2029/802; G11C 2929/4402; G11C 2029/0409; H03M 7/30
See application file for complete search history.

(56) References Cited

U.S. PATENT DOCUMENTS

| | | | |
|---|---|---|---|
| 7,162,669 B2 | 1/2007 | Gross | |
| 7,174,486 B2 | 2/2007 | Adams et al. | |
| 7,406,620 B2 | 7/2008 | Shubat et al. | |
| 7,698,608 B2 | 4/2010 | Riley | |
| 7,757,135 B2 | 7/2010 | Nadeau-Dostie et al. | |
| 8,467,260 B2* | 6/2013 | Gorman | G11C 17/16 365/189.2 |
| 8,537,627 B2* | 9/2013 | Ouellette | G11C 29/787 365/200 |
| 8,570,820 B2 | 10/2013 | Gorman et al. | |
| 8,719,648 B2 | 5/2014 | Gorman et al. | |
| 9,715,456 B2* | 7/2017 | Henry | G06F 12/0875 |
| 2002/0101777 A1 | 8/2002 | Anand et al. | |

* cited by examiner

*Primary Examiner* — Christine Tu
(74) *Attorney, Agent, or Firm* — Venture Pacific Law, PC

(57) ABSTRACT

A fuse controller comprises: a fuse bay, a bus, an engine, and an interface. The fuse bay stores repair and setting information for a plurality of fuse domains in a linked-list data structure. The engine manages the linked-list data structure. The engine also is coupled to the fuse domains via the bus. The interface is coupled to the engine and receives commands and data for operating the engine.

19 Claims, 4 Drawing Sheets

MULTI-DOMAIN FUSE MANAGEMENT

CROSS REFERENCE

This application claims priority from a provisional patent application entitled "Multi-Domain Fuse Management Architecture" filed on Feb. 3, 2015 and having application No. 62/111,605. Said application is incorporated herein by reference.

FIELD OF INVENTION

The present disclosure relates to circuits, methods, and systems for fuse controller management, and, more particularly, to fuse controller management of a plurality of fuse domains.

BACKGROUND

More memory is being embedded into system-on-chip ("SOC") devices in order to provide increasing functionality. Many SOC devices have more than 50% of their area devoted to embedded memories. Ensuring these memories are valid and operating correctly is of the upmost importance for producing SOC devices. In addition, as memory content increases, the memories become more susceptible to defects and variations in the chip parametric as technology feature sizes decrease. Memory failures adversely impact the ability of SOC devices to operate in their intended manner. In order to account for such failures, embedded memories are typically designed to have redundant memory in the form of additional columns, rows and/or locations. The redundant memory can be dynamically substituted for locations within a particular memory that have been diagnosed during a testing phase as exhibiting failure characteristics.

When any one of the cores of a SOC device is powered up, information is conveyed to the memory of that powered-up core, instructing the powered-up core to access a working redundant location within the redundant memory whenever a failed memory location is sought to be accessed. As long as the redundant memory locations may be accessed in lieu for failed memory locations, these memories are considered to be repaired and available for use within the SOC device.

Any reasonable SOC solution requires extensive memory repair capability along with the ability to adjust hardware settings (e.g., timing and voltage levels, and other system settings) based on manufacturing test results. These test results are typically stored in nonvolatile storage elements (typically, but not limited to, efuses) such that the information gathered during manufacturing test is available for use for the final system application. Electronically programmed fuses are typically used to repair the embedded memories with repair data that enables redundant memory locations to be accessed in place of failed memory locations. Typically, a blown fuse is represented by a high logic value, while an intact fuse is represented by a low logic value.

Since there are many cores to provide such information to on a SOC device, the requirement to collect and distribute such repair and setting adjust information in the respective SOC device raises significant difficulties. For instance, the cores can be physically scattered around the SOC device. Furthermore, the cores may serve different functions and may be active at different times. As such, the cores may also be powered down when inactive, as is typical in many low power mobile applications. These factors need to be considered when downloading repair and setting adjustment information stored in efuses to the cores.

Current art may have a separate fuse controller for each of the cores. The separate fuse controllers can download the repair and setting adjustment information for their corresponding core. Whenever a core is powered on, the corresponding fuse controller for that core downloads the repair and setting adjustment information to that core. A considerable drawback of this approach is that having separate fuse controllers requires duplicating circuit blocks, which leads to inefficient use of the SOC device area.

Another solution is to use a single fuse controller with multiple fuse bays, where each separate fuse bay (or other blocked off data block) corresponds to a separate core. Thus, the storage of repair and system information for a particular core cannot be intermingled with the storage of repair and system information for another core in a single fuse bay. Whenever a core needs the repair and system information downloaded to the core, the fuse controller can find the corresponding fuse bay and download all the data from that fuse bay to the core without regard to whether any data in that fuse bay was meant for another core.

Two major issues can arise from such design. First, having multiple fuse bays may lead to inefficient use of the SOC area since certain ones of the fuse bays may have a significant amount of unused memory storage. Second, powering up of individual cores may become difficult if the cores are coupled to a single fuse controller. A method of collecting data from the different cores and shipping it to the fuse controller is often employed via a serial interface or a parallel (addressed) interface. The issue with a serial interface is that all cores in the serial shift path need to be powered up, which cannot always be supported.

Therefore, a fuse management system that supports a single centralized fuse controller with a single fuse bay to handle multiple cores independently is highly desired.

SUMMARY OF INVENTION

Briefly, the disclosure relates to a fuse controller comprising: a fuse bay, wherein the fuse bay stores repair and setting information for a plurality of fuse domains in a linked-list data structure; a bus; an engine, wherein the engine manages the linked list data structure and wherein the engine is coupled to the fuse domains via the bus; and an interface for receiving commands and data for operating the engine.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. A fuse controller of the present disclosure can support several functions, including gathering of test results and manufacturing data from circuits around a respective chip, compressing the information, storing the compressed information in a fuse bay (i.e., fuse write), accessing the compressed information from the fuse bay (i.e., fuse read), decompressing the information, distributing the test results and manufacturing data back to circuits around the chip, and providing a diagnosing and a debugging capability. The fuse controller can communicate with various cores (otherwise referred to as fuse domains) in an independent fashion. To minimize the storage needs of the fuse controller, the information can be encoded into compressed data and stored in the fuse bay. Furthermore, the information stored in the fuse bay can be further stored in a linked list data structure to further minimize the amount of storage necessary to store multiple repair passes for each of the cores. It is understood that a fuse controller of the present disclosure and fuse domains (i.e., cores) are part of a greater SOC device. To aid in the understanding of the present disclosure, other components known to the current art within the SOC device may be omitted from the present disclosure. However, it is appreciated by a person having ordinary skill in the art that the fuse controller of the present disclosure can work in conjunction with such components.

Figure 1:
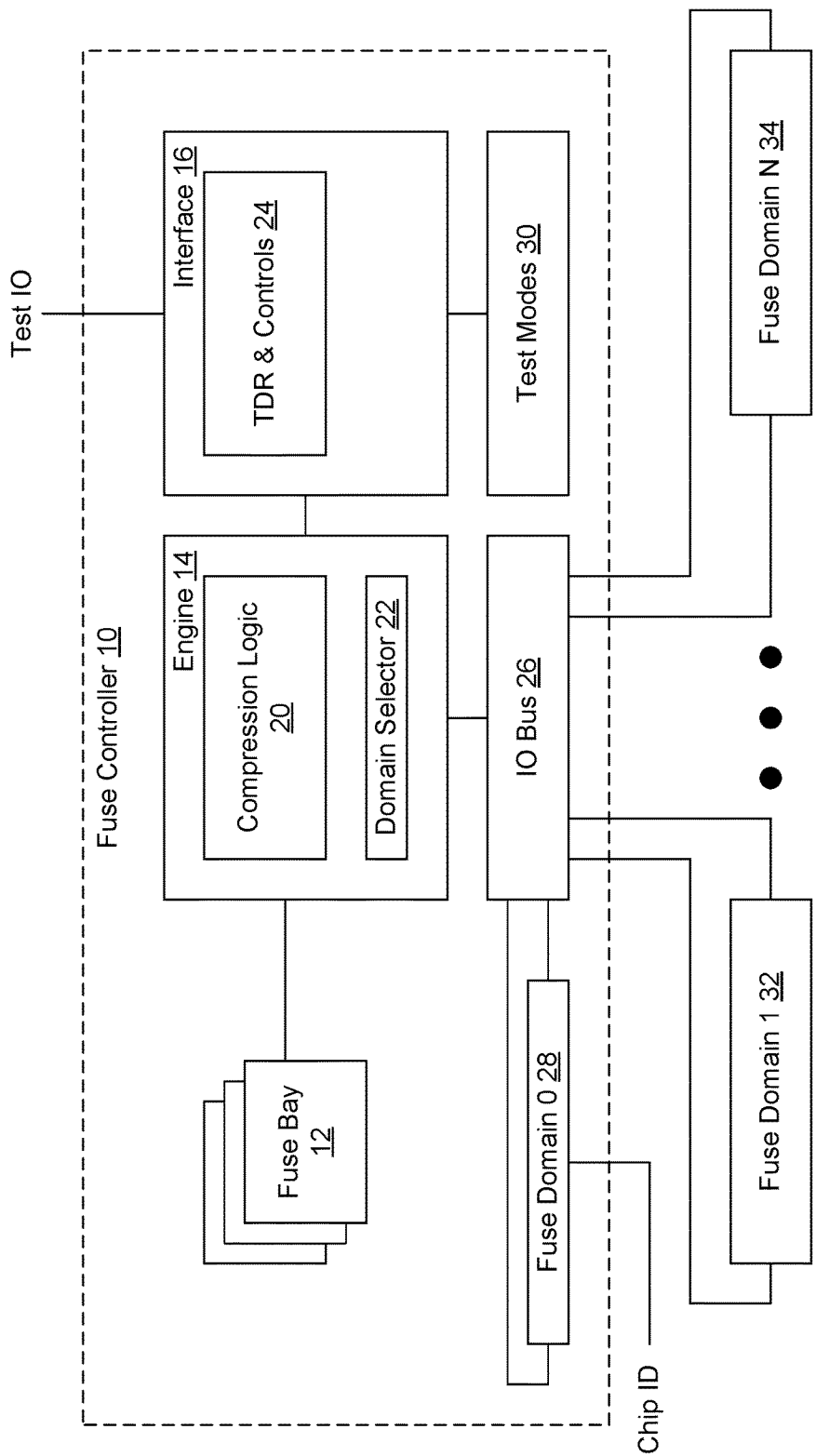
FIG. 1 illustrates a fuse controller system of the present disclosure.

FIG. 1 illustrates a fuse controller system of the present disclosure. A fuse controller system comprises a fuse controller 10 and fuse domains 32-34. The fuse controller 10 provides repair and system information to the fuse domains 32-34. System information can include setting adjustments, chip or core identification information and parametric data, and other system information useful for an SOC's system application. Each of the fuse domains 32-34 can correspond to a core of the SOC device, where each core may have its own embedded memory. The repair and system information allows for various repair and system settings to be applied to the respective cores to make corrections and/or adjustments to the respective cores. The fuse domains can be referenced in order, starting from 0 and incremented by one for each additional fuse domain to N fuse domains.

The fuse controller 10 comprises a fuse bay 12, an engine 14, an interface 16, test modes 30, input/output ("I/O") bus 26, and a fuse domain 28 for fuse domain 0. The test modes 30 and the fuse domain 28 can be optional components of the fuse controller 10. A person having ordinary skill in the art can appreciate that a fuse controller of the present disclosure can be implemented by the fuse bay 12, the engine 14, the interface 16, and the I/O bus 26.

The fuse bay 12 comprises nonvolatile memory (e.g., efuses, laser fuses, read-only memory, flash memory, hard disk drives, magnetic random access memory ("RAM"), and other types of limited programmable or one-time programmable memories, etc.). The fuse bay 12 stores the repair and system information for various fuse domains. When a fuse domain is powered up, the repair and system information for that fuse domain that is stored in the fuse bay 12 can be downloaded to the powered-up fuse domain. The repair and system information for the fuse domains are stored consecutively in the fuse bay 12 to minimize the amount of memory needed to implement the fuse bay 12.

Furthermore, the repair and system information can be compressed and have a corresponding header to identify the contents of the compressed data. The header for each of the compressed data can include a fuse domain identifier field to identify a particular fuse domain that the following compressed data corresponds to; a repair pass identifier to identify a particular repair pass order that the following compressed data corresponds to, a fuses blown identifier to identify whether the following compressed data is stored and valid in the fuse bay 12; and a next header address to identify where a next header is located within the fuse bay 12. The next header address allows for flexibility in the length of the compressed data such that varying lengths of compressed data can be consecutively stored between headers.

The headers for the entries in the fuse bay 12 can be defined to be of equal bit length. Also, additional fields in the headers can be included to provide additional information as desired or needed. The next header address field allows the entries of the fuse bay to form a linked-list data structure. Corresponding compressed data can follow each of the headers of the entries of the linked-list data structure. A header without the fuses blown field enabled can indicate the end of the linked list.

Thereby, a header of an entry of the fuse bay 12 indicates a domain and/or repair pass for the following compressed data of that entry. The engine 14 of the fuse controller 10 can read through the headers of the entries in the fuse bay 12 until it finds active ones, after which, the engine 14 can begin either compressing and blowing fuses in to the fuse bay 12 or decompressing and reading from the fuses of the fuse bay 12.

The engine 14 comprises a compression logic 20 and a domain selector 22. The compression logic 20 provides compression and decompression functionality to compress and/or decompress the repair and system information. The compressed repair and system information can be blown into the fuse bay 12. The decompressed repair and system information can be further downloaded to the corresponding fuse domains. It is understood that compression and decompression algorithms used by the compression logic 20 are well known in the art. Furthermore, a person having ordinary skill in the art can appreciate that various compression and decompression algorithms can be used in conjunction with the present disclosure. For such reason, it is the intent that such compression and decompression algorithms are included in the scope of the present disclosure.

Since compressed data of the repair and system information for various fuse domains may be stored consecutively in the fuse bay, the engine 14 cycles through each of the headers of the entries of the fuse bay 12 for an active fuse domain(s) and/or active repair pass(es). The domain selector 22 contains the logic that determines which fuse domain(s) and repair pass(es) will be active and can process and interpret information stored in previously written headers or generate a new header when additional data is stored. The domain selector cycles through each of the headers of the entries of the fuse bay 12 for an active fuse domain(s) and/or active repair pass(es) using digital counter circuits. The domain selector 22 keeps track of which fuse domain(s) and repair pass(es) have been processed for each instruction and will repeat the compression or decompression actions until all necessary fuse domain(s) and repair pass(es) have been operated upon. The headers used by the domain selector 22 can have the following fields: a fuse domain field, a repair pass order, and a next header address. The engine 14, using the logic in the domain selector 22, can sort through the headers stored in the fuse bay 12 to determine if the correct data has been located to be decompressed and downloaded to a particular fuse domain or an empty location has been found to allow for data to be compressed and blown into the fuse bay 12.

The interface 16 provides a control path to receive test input and output, and relay command instructions and information to the engine 14, which are then decoded in the domain selector 22 to determine which fuse domain(s) and repair pass(es) are active. The test IO can provide input to the interface 16 for powering up a particular fuse domain and to begin any decompressing of repair and system information for such particular fuse domain to download to. The test IO can also provide input to the interface 16 for compressing of repair and system information from such a particular fuse domain, allowing data to be shifted from the fuse domain to the fuse controller 10 for compression and storage. The interface 16 comprises test data registers ("TDR") and controls 24 to implement such capabilities. Furthermore, a number of test modes 30 can be stored and/or programmed into the fuse controller 10 for ease of use and for testing of the fuse domains. The test modes 30 can be provided by a chip designer or otherwise hardcoded by the designer of the fuse controller for testing of the fuse domains.

The interface 16 of the fuse controller can be a standardized interface for programming of the engine of the fuse controller. The interface 16 uses the TDR, which can be connected to any typical SOC network (e.g., IEEE 1149.1 or 1687 networks would suffice). Via that interface, instructions are loaded into the fuse controller to control operations. Various implementations can be used to program the fuse controller via the TDR interface. For instance, different patterns loaded into the TDR can encode different fuse controller operations, including instructions for programming test mode registers, compressing data, decompressing data, etc. It can be appreciated that various implementations can be envisioned in conjunction with the present disclosure.

These instructions loaded into interface 16 determine whether compression or decompression of data for repair and system information for a fuse domain needs to occur. If a compression instruction is loaded the engine 14 can compress the data corresponding to repair or system information in a fuse domain, generate a header to correspond to that compressed data, and blow the header and the compressed data as an entry into a next available space of the fuse bay 12. The various entries in the fuse bay can be consecutively stored in the address space of the fuse bay 12. Since the header of each of the entries can identify the corresponding fuse domain for a particular entry, the engine 14 can locate all the stored entries for a particular fuse domain by sorting through the headers of the fuse bay 12. Similarly, the engine 14 can sort through the headers to locate corresponding repair passes for one or more fuse domains. The engine 14 can then decompress such corresponding data for downloading into the corresponding fuse domain.

The IO bus 26 allows for the domain selector 22 to individually select a particular fuse domain to download data to or load compressed data from or, alternatively, select a plurality of fuse domains to download decompressed repair and system information or load repair and system information for compression. The IO bus 26 can have parallel bus lines independently coupled to each fuse domain such that each fuse domain can be separately managed. The IO bus 26 translates information from the domain selector 22 about which fuse domain(s) is active for a given operation and enables only the specified fuse domain(s).

When a particular fuse domain is being interacted with, a shift signal specific to that domain is asserted and shift signals for all other domains can be deasserted. Only the core/logic associated with that asserted fuse domain needs to be powered up and responsive. This allows a single fuse controller to manage fuse data for any or all domains on a respective SOC independently. This provides great freedom for dealing with a complex SOC that power up/enable different cores independently as is common in low power applications. The SOC simply needs to indicate to the fuse controller which domain(s) are active and the fuse controller can then manage interactions with that domain.

The fuse controller 10 can further comprise the fuse domain 28. The registers in this domain 28 can be loaded or unloaded via register program or read operations, allowing for easy programmable control of the fuse domain 28. The use of this register can vary with each application, but can be used to store chip identifiers ("ID") and other key pieces of information used by the respective SOC device. This register can be unique per die and may include wafer X-Y locations, lot information, wafer number, binning information for temperature and speed grade and any other information deemed appropriate for traceability. This built-in fuse domain removes the need for an independent chip identification function on the SOC device, thereby saving chip area.

The total number of fuse domains can be selected based on the design of the SOC. A separate shift signal can be generated for each fuse domain, allowing the fuse domains to be controlled independently from a common fuse controller. The key information about what fuse domain/repair pass information is stored in which set of fuses is encoded in a header.

The engine 14 can comprise the logic for cycling through the headers in the fuse bay 12 for various active fuse domains and active repair passes. Various combinations of values in the TDR instructions and other test modes (which can disable one or more fuse domains or passes) can be used to determine which domains and/or passes are active or inactive. The engine 14 can also have logic to select a particular bus line for a particular one of the fuse domains to download the decompressed data to.

For instance, the engine can 14 can determine if all domains are selected to be active (e.g., an "allD" field of a command instruction to the interface 16 is enabled), then the fuse domain that is active (the "activeFD") is generated by a domain counter ("fdCnt"), which is used to cycle through all of the domains (and skips any fuse domains that are disabled by a test mode). If the fuse domain "allD" field is inactive, then the value is determined by the value in the fuse domain field of the instruction. This can be true during both read-decompress and compress-blow operations.

If all the repair passes are selected to be active (e.g., a "allP" field of a command instruction to the interface 16 is enabled), then the repair pass that is active (the "activeRP") is generated by a repair pass counter ("rpCnt") that cycles through all passes (and skips any repair passes that are disabled by a test mode). If the repair pass "allP" field is inactive, then the value is determined by the value in the repair pass field of the instruction. This is true during the read-decompress operation. During the compress-blow operation, the repair pass field of the instruction is always used.

The fuse domains 1-N can be separate memory cores within a system-on-chip. Additionally, the fuse domains 1-N can also be spread over various components or chips of a computer processing system. A person having ordinary skill in the art can appreciate the wide range of systems to which the present disclosure can be applied.

Figure 2:
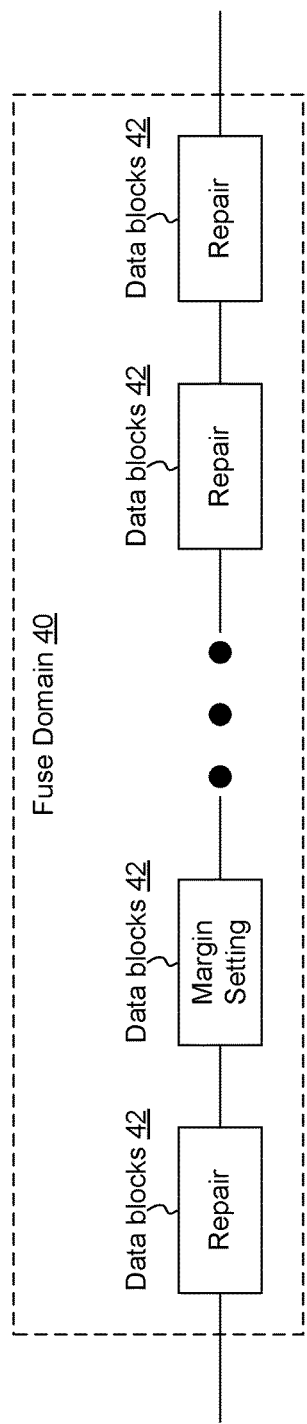
FIG. 2 illustrates an example of types of data downloaded to a fuse domain.

FIG. 2 illustrates an example of types of data downloaded to a fuse domain. Repair and system information can be downloaded to a fuse domain to alter the operation of the fuse domain, either to optimize certain settings and/or repair various components in the fuse domain that are faulty. For instance, repair and margin settings stored in data blocks 42 can be downloaded to a fuse domain 40 by the fuse controller. Whenever the fuse domain is powered on, the repair and margin setting stored in the data blocks 42 are downloaded to the fuse domain 40.

Figure 3:
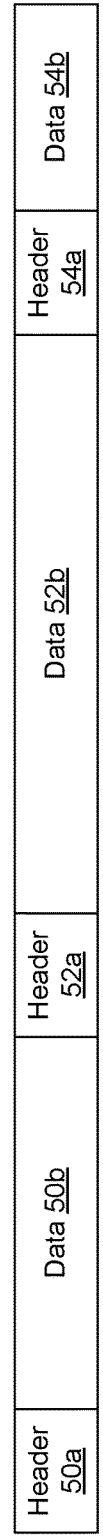
FIG. 3 illustrates a data structure for storing repair and system information.

FIG. 3 illustrates a data structure for storing repair and system information. The fuse bay of a fuse controller of the present disclosure can efficiently store repair and system information for fuse domains by compressing such data and having a header with each entry to identify the contents of that compressed data. In this manner, data can be stored consecutively in the fuse bay, rather than in separate memory devices. For instance, an entry of the fuse bay comprises of a header 50*a* and compressed data 50*b*; another entry comprises a header 52*a* and compressed data 52*b*; yet another entry of the fuse comprises a header 54*a* and compressed data 54*b*; and so on and so forth. The engine of the fuse controller can search for particular compressed data of repair passes and/or compressed data for a particular fuse domain by searching through each of the headers 50*a*-54*a* to locate data for the desired repair pass or desired fuse domain.

Figure 4:
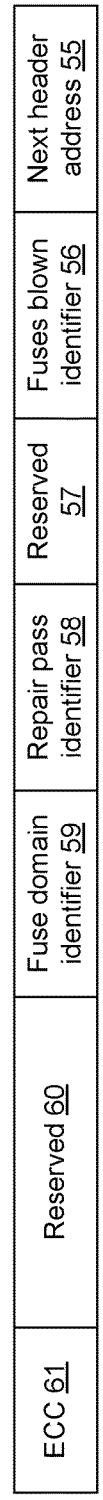
FIG. 4 illustrates a data structure for a header for the repair and system information for a fuse domain.

FIG. 4 illustrates a data structure for a header for the repair and system information for a fuse domain. The header of an entry of the fuse bay can have various formats to identify the contents of its corresponding compressed data. For instance, a header can comprise a next header address field 55, a fuses blown identifier 56, a reserved field 57, a repair pass identifier 58, a fuse domain identifier field 59, a reserved field 60, error correction code ("ECC") field 61. The number of bits for each field can vary depending on the design of the respective fuse controller and the respective SOC. Furthermore, additional fields can be included for other implementations. For instance, the reserved fields 57 and 60 can allow for such flexibility within this example of a header configuration. It is appreciated that other header configurations can be used based on the present disclosure.

Figure 5:
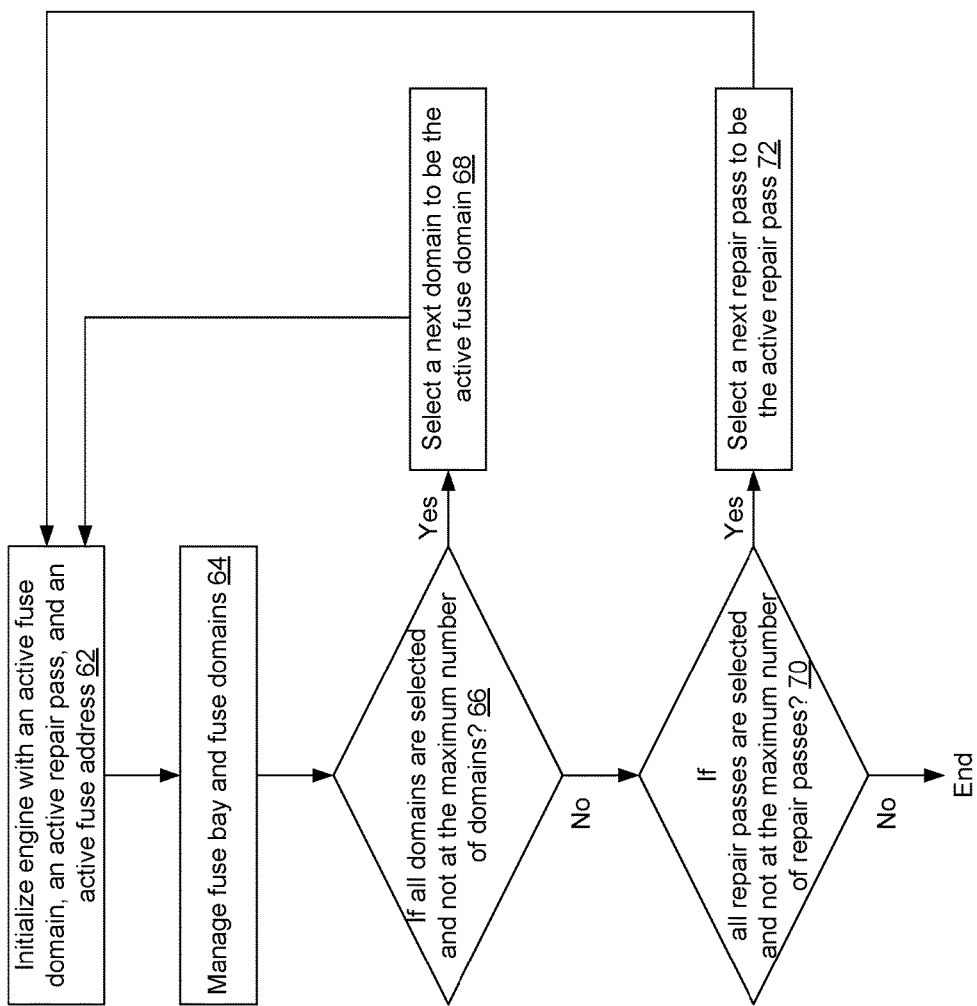
FIG. 5 illustrates a flow chart of the present disclosure for operating a fuse controller.

FIG. 5 illustrates a flow chart of the present invention for operating a fuse controller. A fuse controller can be operated by initializing an engine of the fuse controller, step 62, with repair and system data for an active fuse domain and/or active repair pass. The fuse bay and possibly any active fuse domains can be managed by the engine, step 64. If all the fuse domains are selected for management and not all of the domains have been managed, step 66, then a next fuse domain is selected to be the active fuse domain, step 68, by initializing the engine with the next fuse domain as the active fuse domain. In this manner, if a command to manage all the fuse domains is received by the fuse controller, each of the fuse domains are cycled through until all of the fuse domains are processed by the fuse controller. Cycling can be performed by having a counter which cycles through a first fuse domain to the last fuse domain. When the counter has not reached the maximum number of fuse domains, the looping continues from step 66 by incrementing the counter to select a next fuse domain, in step 68. The process loops back to the beginning with the engine being initialized in step 62 using the next fuse domain.

If all of the fuse domains are not selected (e.g. some are disabled via test modes) or all the fuse domains are selected and the maximum number of fuse domains has been reached, in step 66, then a next decision is performed of whether all the repair passes are selected and the maximum number of repair passes has not been reached, step 70. If all the repair passes are selected and the maximum number of repair passes is not reached, then a next repair pass is selected to be the active repair pass, step 72. In this manner, if a command to select all the repair passes is received by the fuse controller, then the repair passes are cycled through for processing by the fuse controller. Cycling can be performed by using a repair pass counter which is incremented from a first repair pass to a last repair pass. When the counter has not reached the maximum number of repair passes, then the looping continues from step 72 by incrementing the counter in the select a next repair pass step. The process loops back to the beginning with the engine being initialized in step 62 using the next repair pass as the active repair pass.

If all of the repair passes are not selected (e.g. via a test mode) or all of the repair passes are selected and the maximum number of fuse domains has been reached, in step 70, then the fuse controller processing ends.

Figure 6:
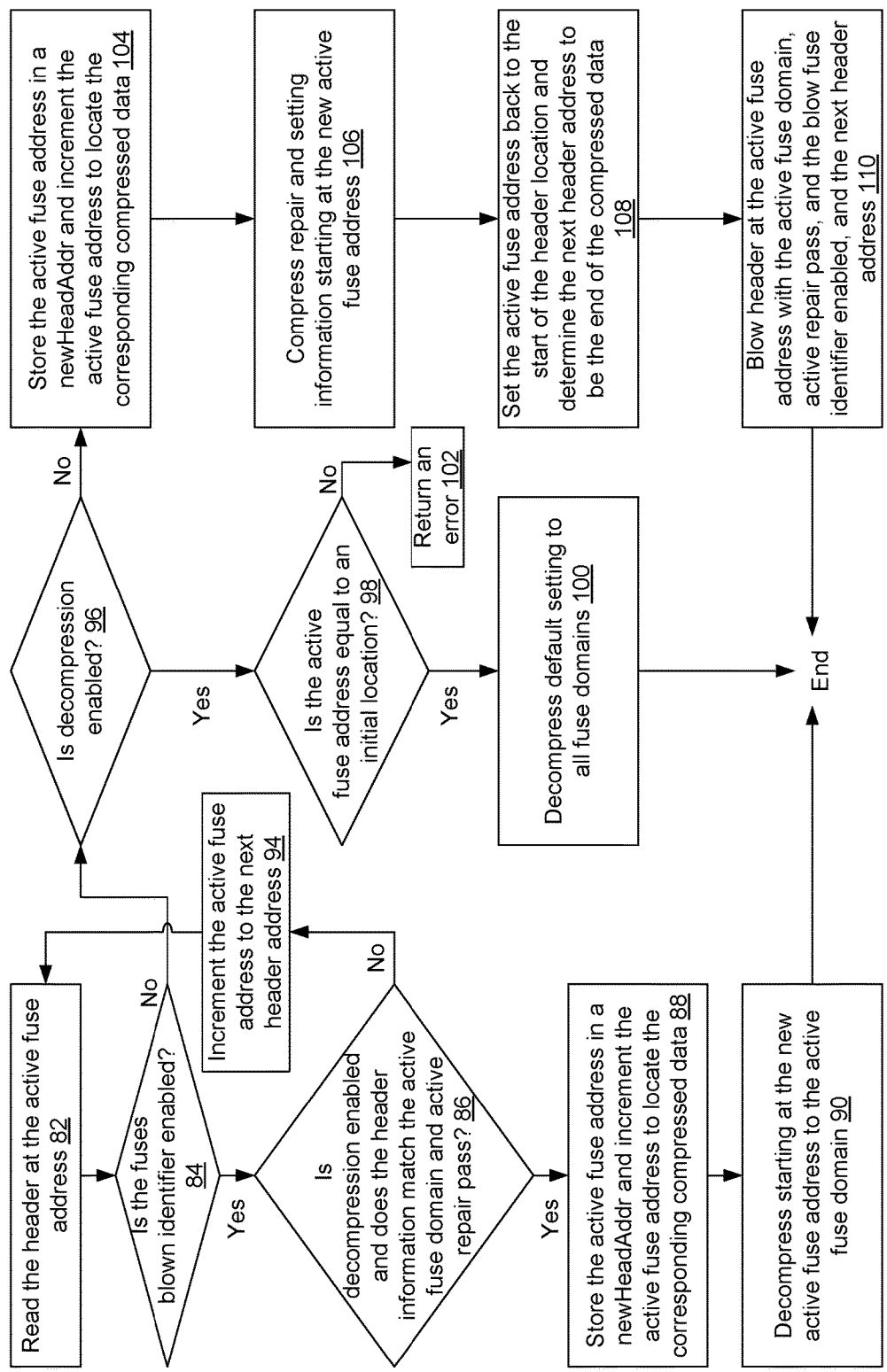
FIG. 6 illustrates a flow chart of the present disclosure for managing an engine of the fuse controller and fuse domains by the fuse controller.

FIG. 6 illustrates a flow chart of the present invention for compression and decompression of fuse data by a fuse controller. The manage fuse bay step 64 by the initialized engine allows for blowing of compressed repair and system data into a fuse bay of the fuse controller and downloading repair and system data into fuse domains from the fuse bay of the fuse controller.

In an example of a flow chart for compression and decompression by the fuse controller, a header for an active fuse address ("Faddr") in the fuse bay can be read, step 82. Typically, the active fuse address starts at the very first address in the fuse bay, i.e., Faddr=0, when the process first starts. Next, a fuses blown identifier of the read header is read to determine if the header has any valid and compressed data stored in the corresponding data section of the respective entry of the header. If not, then it is determined whether decompression has been enabled, step 96. A decompression command can be inputted to the engine via the interface of the fuse controller which receives IO commands.

If decompression is enabled, then it is determined whether the active fuse address is at an initial address location of the fuse bay, i.e., Faddr=0. If not, an error has occurred and an error is returned, step 102. Otherwise, a default setting is decompressed to all fuse domains, step 100. In an example, all zeros can be decompressed to all of the fuse domains. After decompression, the process can end.

If decompression is not enabled, then compression steps can begin. In an example for the compression steps, the active fuse head address can be temporarily saved for later use in a newheadaddr field. Next the active fuse address is incremented to a fuse address for the corresponding compressed data, step 104. The repair and setting information can be compressed in the fuse bay of the fuse controller at the new active fuse address, step 106. The active fuse address, which was incremented, is set back to the previous fuse address by having Faddr equal newheadaddr. The following fuse address after the end of the compressed data in the fuse bay is set to be the next header address, step 108. The corresponding header is blown into the fuse bay at the active fuse address with the following information: the fuse domain for the compressed data, the repair pass for the compressed data, an enabled blown fuse identifier, and the next header address. It can be appreciated that other methods for compressing the repair and setting information can be applied based on the present disclosure. After the header and the compressed data for an entry is stored in the fuse bay, the process can end, reverting back to the flow illustrated earlier for managing the fuse controller.

In step 84, if the fuses blown identifier is enabled (meaning an entry starting at the active fuse address has been inputted to the fuse bay), then the following is determined: (1) whether decompression is enabled; and (2) whether the read header matches an active repair pass and an active fuse domain, step 86. The decompression enablement, the active repair pass, and the active fuse domain can be passed down from the initialization of the engine. If these conditions are not met, the active fuse address is incremented to the next header address field provided by the read header, step 94. If so, then the active fuse address is stored for later use in the newheadaddr field. The active fuse address is incremented to the address of the corresponding compressed data, step 88. The compressed data can then be decompressed to the active fuse domain, step 90. Next, the process can end, and any additional entries can be searched for compression or decompression.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skill in the art.

We claim:

1. A fuse controller comprising:
    a fuse bay, wherein the fuse bay has repair and setting information for a plurality of fuse domains in a linked-list data structure;
    a bus;
    an engine for managing the linked list data structure, wherein the engine is coupled to the fuse domains via the bus; and
    an interface for receiving commands and data for operating the engine,
    wherein the fuse bay is a nonvolatile memory storage device,
    wherein entries of the linked-list data structure are consecutively stored in the nonvolatile memory storage, and
    wherein each of the entries has a pointer to a next consecutive entry in the linked-list data structure.

2. The fuse controller of claim 1 wherein each entry of the linked-list data structure has a domain identifier field to associate the respective entry to one of the fuse domains and a repair pass identifier to associate the respective entry to a particular order within a repair pass.

3. The fuse controller of claim 1 wherein the engine processes each of the entries of the linked-list data structure to determine if any one of the entries correspond to an active one of the fuse domains.

4. The fuse controller of claim 3 wherein the any one of the entries that corresponds to the active one of the fuse domains is sorted based upon a repair pass identifier of the any one of the entries that correspond to the active one of the fuse domains.

5. The fuse controller of claim 1 wherein the interface receives a certain repair pass information for an active one of the fuse domains, wherein the engine compresses the certain repair pass information for the active one of the fuse domains and generates a corresponding header having a domain identifier field to indicate the active one of the fuse domains and a repair pass identifier to indicate a particular order within a repair pass for the active one of the fuse domains, and wherein the compressed repair information and the corresponding header are blown to the fuse bay at a next available address of the fuse bay.

6. The fuse controller of claim 1 wherein the linked-list data structure comprises entries, wherein each of the entries comprises a header and compressed repair and setting information, and wherein the header has a domain identifier field and a repair pass identifier field.

7. The fuse controller of claim 6 wherein the interface receives a command to download repair and setting information for one or more active ones of the fuse domains, wherein the engine searches the fuse bay for any entries that are associated to the one or more active ones of the fuse domains, wherein the engine decompresses the compressed repair and setting information of the associated entries to the one or more active ones of the fuse domains, and wherein the engine downloads the decompressed repair and setting information to the respective one or more active ones of the fuse domains.

8. The fuse controller of claim 7 wherein the engine is independently coupled to the fuse domains via the bus, wherein the bus comprises shift enable and shift data signals, and wherein the decompressed repair and setting information for the one or more active ones of the fuse domains are downloaded to the respective one or more active ones of the fuse domains via the signals.

9. The fuse controller of claim 1
    wherein one or more active fuse domains, one or more active repair passes, and an active fuse address are inputted to the interface;
    wherein the engine is initialized with the one or more active fuse domains, the one or more active repair passes, and the active fuse address via the interface,
    wherein the engine manages the fuse bay and the fuse domains as a function of one of the active domains, the one of the active repair passes, and the active fuse address;
    wherein the engine determines if each of the active one or more domains are processed, if not, the engine recursively processes a next one of the one or more active fuse domains until all of the active fuse domains have been processed, and
    wherein the engine determines if each of the one or more active repair passes are processed, if not, the engine recursively processes a next one of the one or more active repair passes until all of the ones of the active repair passes have been processed.

10. The fuse controller of claim 9 wherein in the managing of the fuse bay and the fuse domains, the engine determines whether to perform one or more of the following operations:
    compress and blow data into the fuse bay;
    decompress and download data from the fuse bay to a certain one or more ones of the fuse domains as a function of the headers of the entries in the fuse bay;
    download a default setting to all of the fuse domains; and
    return an error message.

11. A fuse controller comprising:
    a fuse bay, wherein the fuse bay stores repair and setting information for a plurality of fuse domains in a linked-list data structure, wherein the fuse bay is a nonvolatile memory storage device, wherein entries of the linked-list data structure are consecutively stored in the non-volatile memory storage, wherein each of the entries has a pointer to a next consecutive entry in the linked-list data structure, and wherein each entry of the linked-list data structure has a domain identifier field to associate the respective entry to one of the fuse domains and a repair pass identifier to associate the respective entry to a particular order within a repair pass;

a bus;

an engine, wherein the engine manages the linked list data structure, wherein the engine is coupled to the fuse domains via the bus, wherein the engine processes each of the entries of the linked-list data structure to determine if any of the entries correspond to an active one of the fuse domains, and wherein the any of the entries that correspond to the active one of the fuse domains is sorted based upon a repair pass identifier of the any one of the entries that correspond to the active one of the fuse domains; and an interface for receiving commands and data for operating the engine.

12. The fuse controller of claim 11 wherein the interface receives a certain repair pass information for the active one of the fuse domains, wherein the engine compresses the certain repair pass information for the active one of the fuse domains and generates a corresponding header having a respective domain identifier field to indicate the active one of the fuse domains and a respective repair pass identifier to indicate a particular order within a repair pass for the active one of the fuse domains, and wherein the compressed repair information and the corresponding header are blown to the fuse bay at a next available address of the fuse bay.

13. The fuse controller of claim 11 wherein the interface receives a command to download repair and setting information for one or more active ones of the fuse domains, wherein the engine searches the fuse bay for any entries that are associated to the one or more active ones of the fuse domains, wherein the engine decompresses the compressed repair and setting information of the associated entries to the one or more active ones of the fuse domains, wherein the engine downloads the decompressed repair and setting information to the respective one or more active ones of the fuse domains, wherein the engine is independently coupled to the fuse domains via the bus, and wherein the bus comprises shift enable and shift data signals, and wherein the decompressed repair and setting information for the one or more active ones of the fuse domains are downloaded to the respective one or more active ones of the fuse domains via the signals.

14. The fuse controller of claim 11 wherein one or more active fuse domains, one or more active repair passes, and an active fuse address are inputted to the interface;

wherein the engine is initialized with the one or more active fuse domains, the one or more active repair passes, and the active fuse address via the interface, wherein the engine manages the fuse bay and the fuse domains as a function of one of the active domains, the one of the active repair passes, and the active fuse address;

wherein the engine determines if each of the active one or more domains are processed, if not, the engine recursively processes a next one of the one or more active fuse domains until all of the active fuse domains have been processed, and wherein the engine determines if each of the one or more active repair passes are processed, if not, the engine recursively processes a next one of the one or more active repair passes until all of the ones of the active repair passes have been processed.

15. The fuse controller of claim 14 wherein in the managing of the fuse bay and the fuse domains, the engine determines whether to perform one or more of the following operations:

compress and blow data into the fuse bay;

decompress and download data from the fuse bay to a certain one or more ones of the fuse domains as a function of the headers of the entries in the fuse bay;

download a default setting to all of the fuse domains; and return an error message.

16. A method for operating a fuse controller having a fuse bay, a bus, an engine, and an interface for receiving commands and data for operating the engine, wherein the fuse bay stores repair and setting information for a plurality of fuse domains in a linked-list data structure, wherein the engine manages the linked list data structure, wherein the engine is coupled to the fuse domains via the bus, and wherein each entry of the linked-list data structure has a domain identifier field to associate the respective entry to one of the fuse domains and a repair pass identifier to associate the respective entry to a particular order within a repair pass, comprising the steps of:

inputting to the interface one or more active fuse domains, one or more active repair passes, and an active fuse address;

initializing the engine with the one or more active fuse domains, the one or more active repair passes, and the active fuse address via the interface;

managing by the engine the fuse bay and the fuse domains as a function of one of the active domains, the one of the active repair passes, and the active fuse address, wherein in the managing of the fuse bay and the fuse domains, the engine determines whether to perform one of the following:

compressing and blowing data into the fuse bay;

decompressing and downloading data from the fuse bay to a certain one or more ones of the fuse domains as a function of the headers of the entries in the fuse bay;

downloading a default setting to all of the fuse domains; or returning an error message;

determining by the engine if each of the active one or more domains are processed, if not, the engine recursively processes a next one of the one or more active fuse domains until all of the active fuse domains have been processed; and determining by the engine if each of the one or more active repair passes are processed, if not, the engine recursively processes a next one of the one or more active repair passes until all of the ones of the active repair passes have been processed.

17. The method of claim 16 wherein the fuse bay is a nonvolatile memory storage device, wherein entries of the linked-list data structure are consecutively stored in the nonvolatile memory storage, wherein each of the entries has a pointer to a next consecutive entry in the linked-list data structure, wherein the engine processes each of the entries of the linked-list data structure to determine if any of the entries correspond to an active one of the fuse domains, and wherein the any of the entries that correspond to the active one of the fuse domains is sorted based upon a repair pass identifier of the any one of the entries that correspond to the active one of the fuse domains.

18. The method of claim 16 wherein the interface receives a certain repair pass information for the active one of the fuse domains, wherein the engine compresses the certain repair pass information for the active one of the fuse domains and generates a corresponding header having a respective domain identifier field to indicate the active one of the fuse domains and a respective repair pass identifier to indicate a particular order within a repair pass for the active one of the fuse domains, and wherein the compressed repair information and the corresponding header are blown to the fuse bay at a next available address of the fuse bay.

19. The method claim 16 wherein the interface receives a command to download repair and setting information for one or more active ones of the fuse domains, wherein the engine searches the fuse bay for any entries that are associated to the one or more active ones of the fuse domains, wherein the engine decompresses the compressed repair and setting information of the associated entries to the one or more active ones of the fuse domains, wherein the engine downloads the decompressed repair and setting information to the respective one or more active ones of the fuse domains, wherein the engine is independently coupled to the fuse domains via the bus, wherein the bus comprises shift enable and shift data signals, and wherein the decompressed repair and setting information for the one or more active ones of the fuse domains are downloaded to the respective one or more active ones of the fuse domains via the signals.

\* \* \* \* \*